US008477461B2

(12) United States Patent
Chou et al.

(10) Patent No.: US 8,477,461 B2
(45) Date of Patent: Jul. 2, 2013

(54) THIN FILM MAGNETIC HEAD HAVING A PAIR OF MAGNETIC LAYERS WHOSE MAGNETIZATION IS CONTROLLED BY SHIELD LAYERS

(75) Inventors: Tsutomu Chou, Tokyo (JP); Yoshihiro Tsuchiya, Tokyo (JP); Shinji Hara, Tokyo (JP); Daisuke Miyauchi, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 892 days.

(21) Appl. No.: 12/219,841

(22) Filed: Jul. 29, 2008

(65) Prior Publication Data

US 2010/0027168 A1     Feb. 4, 2010

(51) Int. Cl.
*G11B 5/39* (2006.01)
*G11B 5/10* (2006.01)

(52) U.S. Cl.
USPC ...................................... 360/319; 360/324.12

(58) Field of Classification Search
USPC ............................. 360/324, 319, 324.12, 317
See application file for complete search history.

(56) References Cited

U.S. PATENT DOCUMENTS

| | | | | |
|---|---|---|---|---|
| 5,515,221 | A * | 5/1996 | Gill et al. | 360/319 |
| 6,512,661 | B1 * | 1/2003 | Louis | 360/324.12 |
| 6,724,583 | B2 | 4/2004 | Seigler et al. | |
| 6,985,338 | B2 * | 1/2006 | Gill | 360/324.12 |
| 7,035,062 | B1 | 4/2006 | Mao et al. | |
| 7,180,716 | B2 * | 2/2007 | Li et al. | 360/324.12 |
| 7,330,339 | B2 * | 2/2008 | Gill | 360/324.11 |
| 7,397,637 | B2 * | 7/2008 | Gill | 360/324.12 |
| 7,446,986 | B2 * | 11/2008 | Araki et al. | 360/324.12 |
| 8,049,997 | B2 * | 11/2011 | Miyauchi et al. | 360/319 |
| 8,369,048 | B2 * | 2/2013 | Miyauchi et al. | 360/319 |
| 2002/0186516 | A1 * | 12/2002 | Larson et al. | 360/324.12 |
| 2003/0030948 | A1 | 2/2003 | Umetsu | |
| 2006/0044706 | A1 * | 3/2006 | Gill | 360/324.12 |
| 2006/0044707 | A1 * | 3/2006 | Araki et al. | 360/324.12 |
| 2006/0044708 | A1 * | 3/2006 | Gill | 360/324.12 |
| 2009/0286106 | A1 * | 11/2009 | Gill et al. | 428/811.2 |
| 2010/0039734 | A1 * | 2/2010 | Hara et al. | 360/319 |
| 2010/0149689 | A1 * | 6/2010 | Tsuchiya et al. | 360/234.3 |
| 2011/0279923 | A1 * | 11/2011 | Miyauchi et al. | 360/75 |

FOREIGN PATENT DOCUMENTS

| | | |
|---|---|---|
| CN | 1146588 | 4/1997 |
| JP | 02226509 A  *  | 9/1990 |

(Continued)

OTHER PUBLICATIONS

Rejection Notice issued from the Japanese Patent Office mailed on Apr. 21, 2010 in the corresponding Japanese patent application No. 2009-015659 (with English translation).

(Continued)

*Primary Examiner* — Julie Anne Watko
(74) *Attorney, Agent, or Firm* — Posz Law Group, PLC

(57) ABSTRACT

A thin film magnetic head including an MR laminated body composed of a first and second MR magnetic layers, first and second shield layers, and a bias magnetic field application layer provided on an opposite side of an air bearing surface (ABS) of the MR laminated body in order to apply a bias magnetic field orthogonal relative to the ABS. The first shield layer includes a first exchange coupling magnetic field application layer and a first antiferromagnetic layer; and the second shield layer includes a second exchange coupling magnetic field application layer and a second antiferromagnetic layer.

16 Claims, 14 Drawing Sheets

FOREIGN PATENT DOCUMENTS

| | | |
|---|---|---|
| JP | A-H08-0212521 | 8/1996 |
| JP | A-H09-274712 | 10/1997 |
| JP | 2003-60264 A | 2/2003 |
| JP | A-2007-109807 | 4/2007 |
| JP | B-3950045 | 4/2007 |

OTHER PUBLICATIONS

Office Action issued Aug. 24, 2011 in corresponding CN application No. 200910139071.9 (English translation).

\* cited by examiner

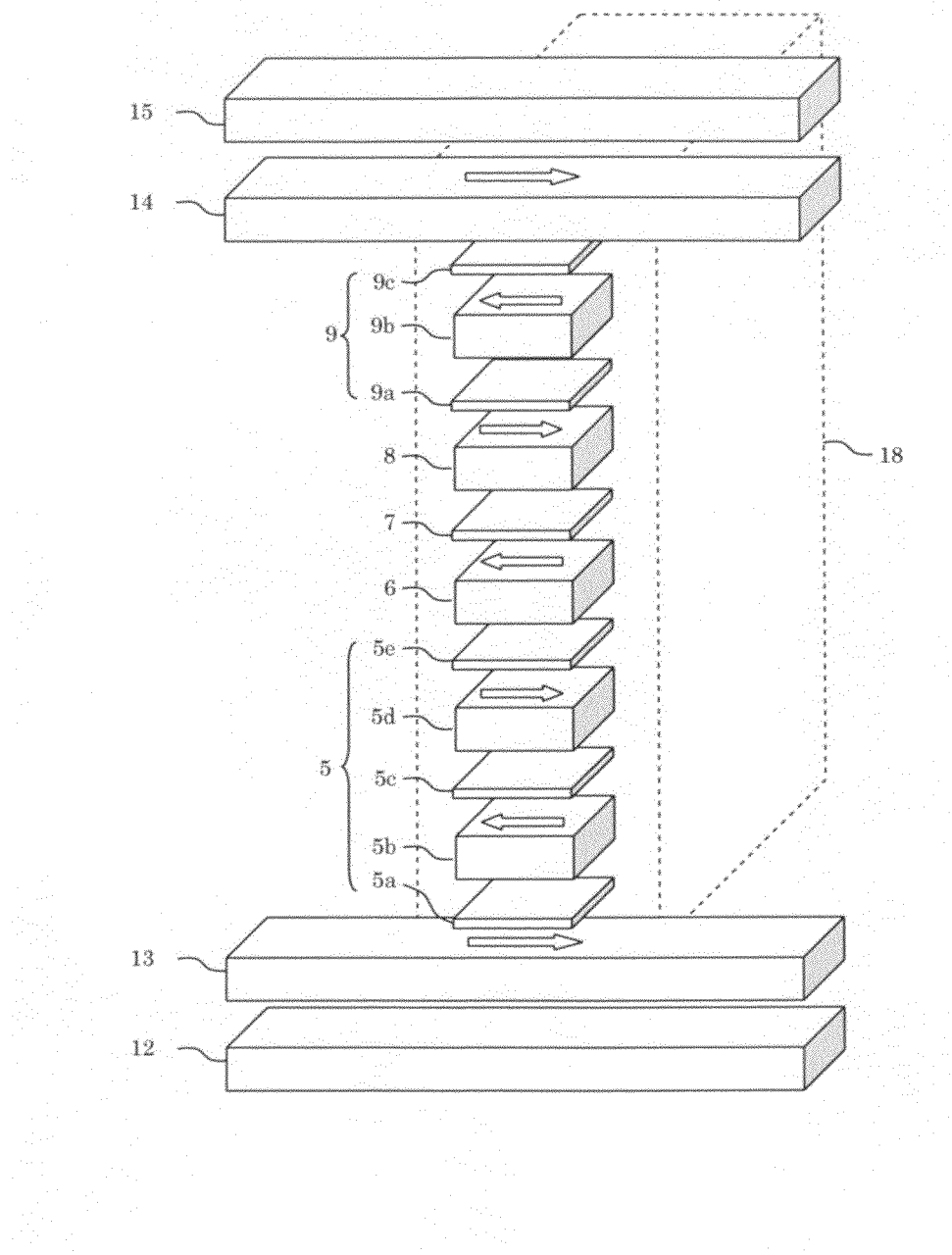

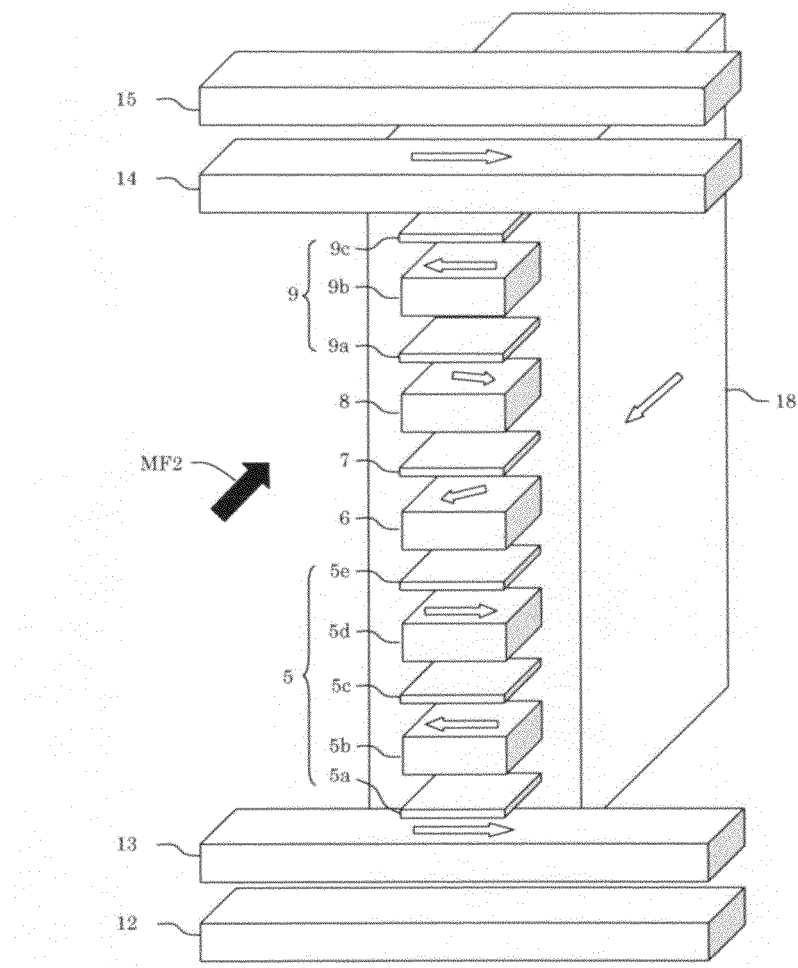

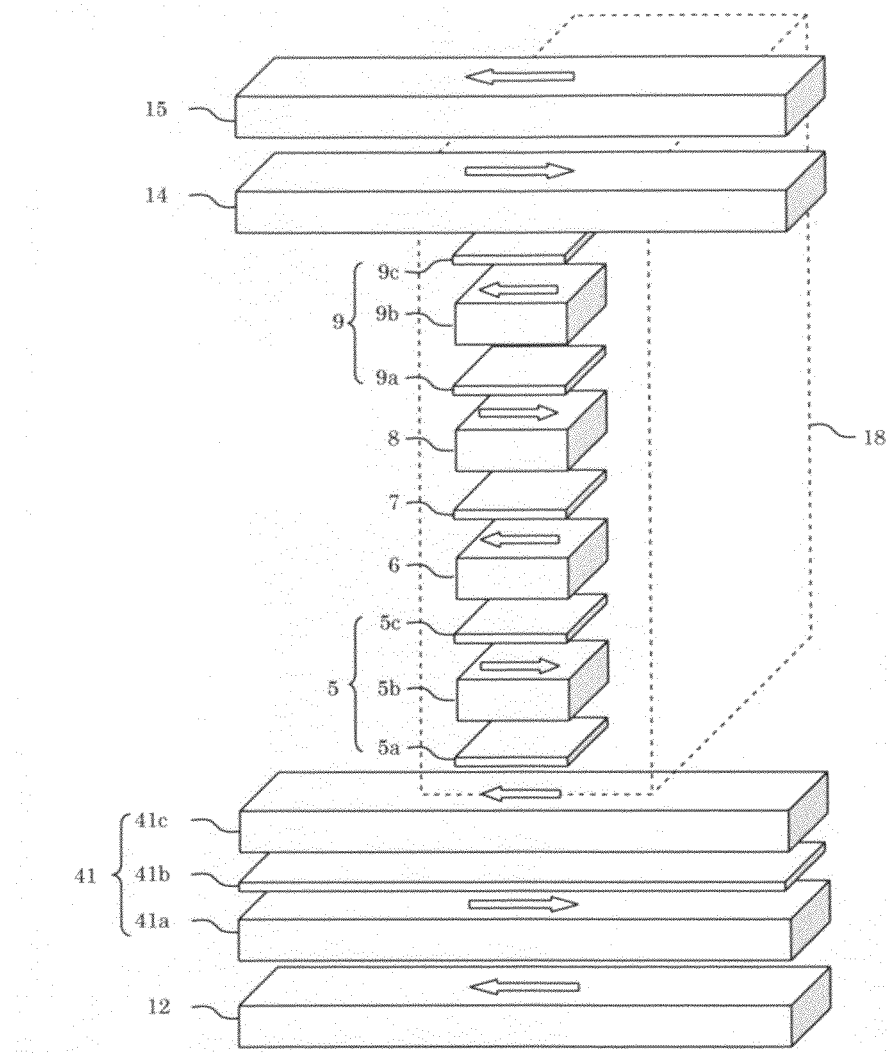

THIN FILM MAGNETIC HEAD HAVING A PAIR OF MAGNETIC LAYERS WHOSE MAGNETIZATION IS CONTROLLED BY SHIELD LAYERS

BACKGROUND

1. Field of the Invention

The present invention relates to a thin film magnetic head. Specifically, the present invention relates to the device structure of a thin film magnetic head equipped with a pair of magnetic layers that change in the direction of magnetization in response to an external magnetic field.

2. Description of the Related Art

As the high-density recording of hard disk drive (HDD) has been developed, heads of high sensitivity and high output have been required. A spin valve head was invented as a head that satisfies the aforementioned requirements. A spin valve head is provided with a pair of ferromagnetic layers on both sides of a nonmagnetic middle layer. An antiferromagnetic layer is disposed in contact with one ferromagnetic layer, and the direction of magnetization in the ferromagnetic layer is fixed in one direction by means of exchange coupling with the antiferromagnetic layer. The direction of magnetization in the other ferromagnetic layer freely rotates in response to an external magnetic field. Such a ferromagnetic layer is referred to as a free layer. In a spin valve head, the change in the relative angle of spins in these two ferromagnetic layers brings about the change in magnetic resistance. A pair of the aforementioned ferromagnetic layers is put between a pair of shield layers, whereby an external magnetic field applied from an adjacent bit on the same track of a recording medium is shielded.

The exchange coupling between an antiferromagnetic layer and a ferromagnetic layer is one of essential characteristics in a spin valve head. Nevertheless, as high-density recording is further advanced, an antiferromagnetic layer cannot be contained within a read gap (i.e., the width of a medium signal in the traveling direction in the medium at a time when a magnetic head reads the signal, which is correlated with the thickness of a film put between shields) if the read gap approaches about 20 nm. Accordingly, we need technology for changing the relative angle between the directions of magnetization in two ferromagnetic layers in response to an external magnetic field by controlling the direction of magnetization in a ferromagnetic layer by some means. U.S. Pat. No. 7,035,062 has disclosed a thin film magnetic head comprising two free layers that change in the direction of magnetization in response to an external magnetic field and a nonmagnetic middle layer put between the aforementioned two free layers. The two free layers are exchange-coupled via the nonmagnetic middle layer by the RKKY (Rudermann, Kittel, Kasuya, Yoshida) interaction and are magnetized in the antiparallel direction to each other at a time when there is no magnetic field applied (i.e., the magnetic field-free state, as used herein). On the rear face of the two free layers and nonmagnetic middle layer seen from the opposing face of a recording medium (or an air bearing surface, hereinafter ABS) is provided a bias magnetic layer, and the bias magnetic field is applied in the direction at right angles to the ABS.

A magnetic field applied from the bias magnetic layer causes the direction of magnetization to have a specific relative angle in the two free layers. If an external magnetic field is applied from a recording medium in the direction at right angles to the ABS at the time, the relative angle between the directions of magnetization in the two free layers will be changed, which leads to the change in the electric resistance of a sense current. As a result, the external magnetic field can be detected. Thus, using two free layers in the film configuration eliminates an antiferromagnetic layer, thereby simplifying the film configuration and easily reducing a read gap. As used herein, the term "parallel" refer to the state in which the direction of magnetization is parallel to each other in the same direction and the term "antiparallel" refers to the state in which the direction of magnetization is parallel to each other in the opposite direction.

Nevertheless, in the thin film magnetic head using a method for magnetically connecting two free layers by the RKKY interaction, the type of materials usable as a nonmagnetic middle layer is limited. Nor can any improvement in the rate of change in magnetoresistance be expected. Accordingly, another technology is required for magnetizing two free layers in the antiparallel direction to each other.

SUMMARY

The present invention relates to a thin film magnetic head comprising a Magneto Resistance ("MR") laminated body composed of a first MR magnetic layer (free layer) whose direction of magnetization changes in response to an external magnetic field, a nonmagnetic middle layer and a second MR magnetic layer (free layer) whose direction of magnetization changes in response to an external magnetic field in contact with each other in the aforementioned order and a bias magnetic field application layer provided for the MR laminated body on the opposite side of the ABS in order to apply a bias magnetic field orthogonal relative to the ABS. The object of the present invention is to provide a thin film magnetic head that allows not only producing a high rate of change in magnetoresistance by controlling the direction of magnetization in the two MR magnetic layers in the magnetic field-free state into the antiparallel direction to each other without relying on the magnetic interaction between those MR magnetic layers but also easily reducing a read gap.

The thin film magnetic head according to one embodiment of the present invention comprises an MR laminated body composed of a first MR magnetic layer whose direction of magnetization changes in response to an external magnetic field, a nonmagnetic middle layer and a second MR magnetic layer whose direction of magnetization changes in response to an external magnetic field, wherein the first MR magnetic layer, the nonmagnetic middle layer and the second MR magnetic layer are in contact with each other in the aforementioned order, first and second shield layers which are provided facing the first MR magnetic layer and the second MR magnetic layer, respectively, and which are arranged in a matter of sandwiching the MR laminated body in a orthogonal direction relative to a film surface of the MR laminated body, and also which function as electrodes for flowing a sense current in the orthogonal direction relative to the film surface of the MR laminated body, a bias magnetic field application layer provided on an opposite side of an air bearing surface (ABS) of the MR laminated body in order to apply a bias magnetic field orthogonal relative to the ABS.

The first shield layer comprises a first exchange coupling magnetic field application layer, which is provided facing the first MR magnetic layer and allows applying an exchange coupling magnetic field to the first MR magnetic layer in the direction parallel to the ABS, and a first antiferromagnetic layer, which is provided in contact with the first exchange coupling magnetic field application layer on the rear face of the first exchange coupling magnetic field application layer seen from the first MR magnetic layer and is antiferromagnetically coupled with the second exchange coupling magnetic field application layer. The second shield layer comprises a second exchange coupling magnetic field application layer, which is provided facing the second MR magnetic layer and allows applying the exchange coupling magnetic field to the second MR magnetic layer in the direction parallel to the ABS and antiparallel to the exchange coupling magnetic field applied to the first MR magnetic layer from the first exchange coupling magnetic field application layer, and a second antiferromagnetic layer, which is provided in contact with the second exchange coupling magnetic field application layer on the rear face of the second exchange coupling magnetic field application layer seen from the second MR magnetic layer and is antiferromagnetically coupled with the second exchange coupling magnetic field application layer.

In the thin film magnetic head having the aforementioned configuration, the first and second MR magnetic layers receive magnetic fields applied from the first and second exchange coupling magnetic field application layers whose directions of magnetization are strongly fixed by being antiferromagnetically coupled with the first and second antiferromagnetic layers, respectively. Since a magnetic field applied from the first exchange coupling magnetic field application layer and a magnetic field applied from the second exchange coupling magnetic field application layer are antiparallel to each other, the first and second MR magnetic layers are magnetized in the antiparallel direction in the magnetic field-free state. However, the first and second MR magnetic layers receive a bias magnetic field from the bias magnetic field application layer in the direction at right angles to the ABS and, therefore, are magnetized in the intermediate state between parallel and antiparallel, which is the initial magnetized state. At a time when an external magnetic field is applied to a recording medium, the relative angle between the directions of magnetization in the first and second MR magnetic layers fluctuates depending on the size and orientation of an external magnetic field. Accordingly, it is possible to detect the external magnetic field using the magnetoresistance effect.

Moreover, the first and second antiferromagnetic layers and the first and second exchange coupling magnetic field application layers also function as shield layers and, therefore, contribute to a decline in a read gap. The present invention is mainly characterized in that the shield layers are magnetically coupled with the MR magnetic layers unlike the conventional way in which no shield layer is magnetically coupled with an MR magnetic layer.

Thus, the present invention can provide a thin film magnetic head that allows not only providing a high rate of change in magnetoresistance but also easily reducing a read gap.

The aforementioned object, other objects, characteristics and advantages of the present invention will be described below in more detail with reference to attached drawings illustrating the present invention.

BRIEF DESCRIPTION OF THE DRAWINGS

FIG. 3A~FIG. 3D are schematic views showing the operating principle of the thin film magnetic head in FIG. 1.

FIG. 5 is a schematic view showing the configuration of the thin film magnetic head and operating principle according to an alternative embodiment of the present invention.

DETAILED DESCRIPTION

Figure 1:
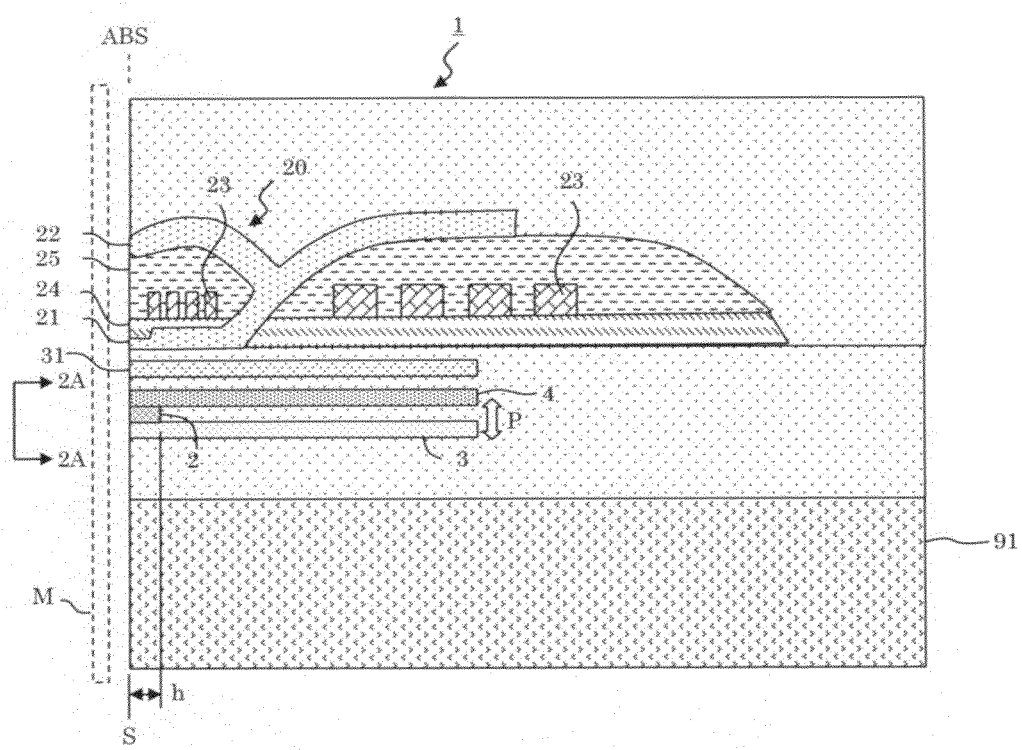
FIG. 1 is a side sectional view of the thin film magnetic head according to one embodiment of the present invention.
Figure 2A:
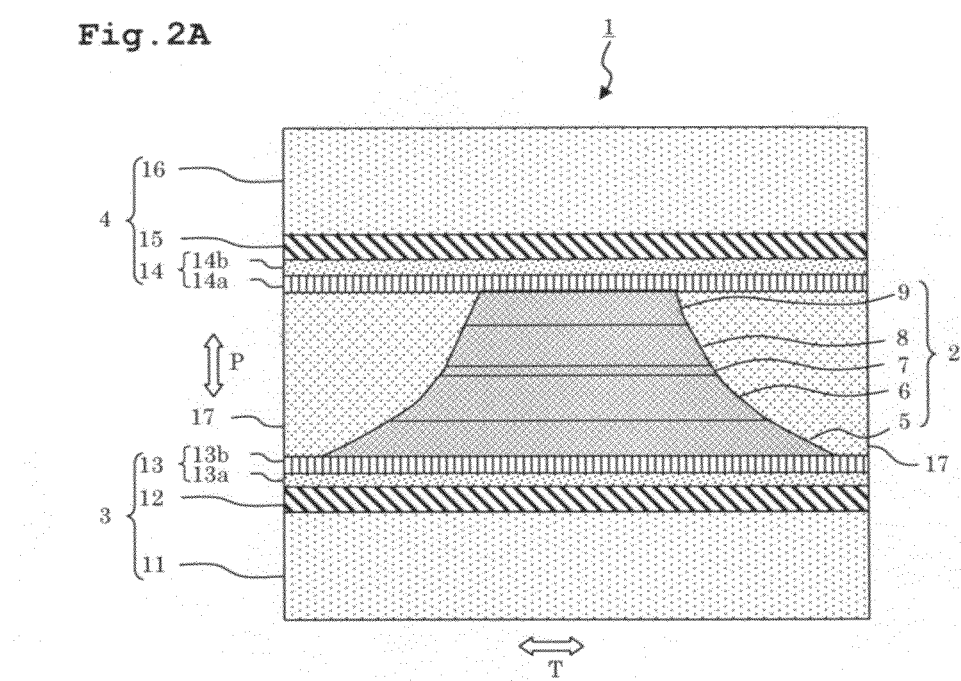
FIG. 2A is a side view of the reading part of the thin film magnetic head seen from the 2A-2A direction in FIG. 1.
Figure 2B:
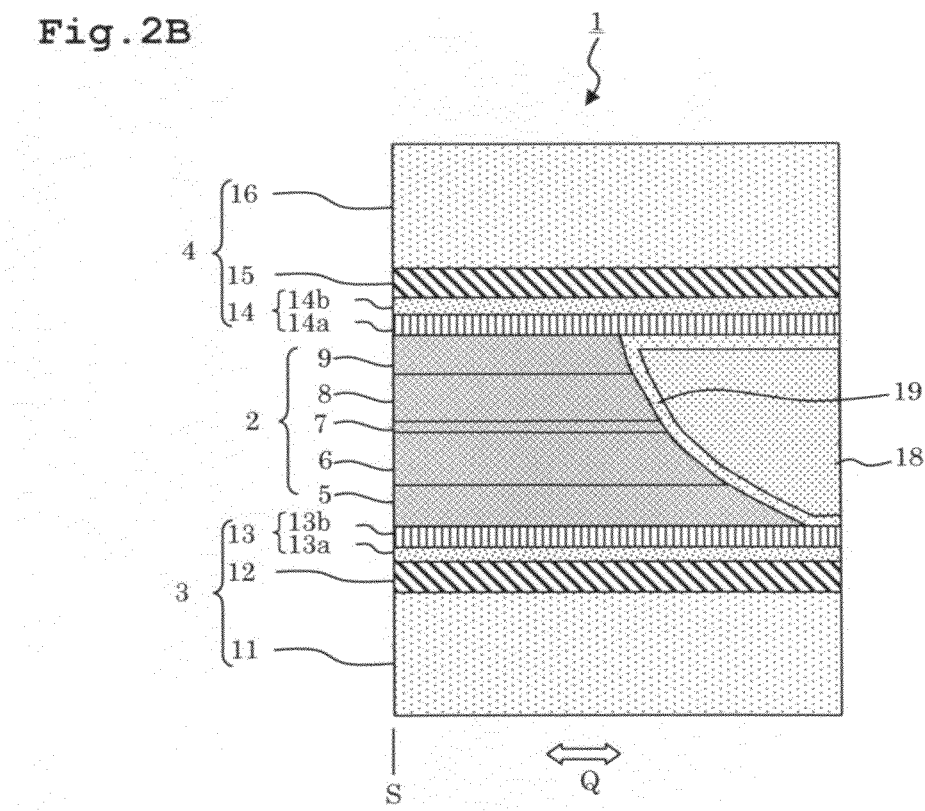
FIG. 2B is a sectional view of the reading part of the thin film magnetic head seen from the direction in FIG. 1.

A description of the thin film magnetic head according to one embodiment of the present invention is given below with reference to drawings. FIG. 1 is a side sectional view of the thin film magnetic head according to one embodiment of the present invention. FIG. 2A is a side view of the reading part of the thin film magnetic head seen from the 2A-2A direction (i.e., the ABS S in FIG. 1. FIG. 2B is a sectional view of the reading part of the thin film magnetic head seen from the direction in FIG. 1. The ABS S is the face of a thin film magnetic head 1 on the side facing a recording medium M.

The thin film magnetic head 1 comprises an MR laminated body 2 and first and second shield layers provided on both sides of the MR laminated body in the direction P at right angles to the film surface of the MR laminated body 2. Table 1 shows film configurations of the MR laminated body 2 and the first and second shield layers 3 and 4. The table shows the laminated layers from first shield layer 3 to second shield layer 4 from bottom up. The direction of magnetization in the table corresponds to the direction of magnetization in FIG. 3A.

TABLE 1

| | Layer configuration | | Thickness (nm) | Direction of magnetization |
|---|---|---|---|---|
| Second shield layer 4 | Second main shield layer 16 | NiFe layer | 1000~2000 | |
| | Second antiferromagnetic layer 15 | IrMn layer | 6 | |
| | Second exchange coupling magnetic field application layer 14 | CoFe layer 14b | 1.5 | |
| | | NiFe layer 14a | 20 | → |
| MR laminated body 2 | Second exchange coupling transmission layer 9 | Ru layer 9c | 0.8 | |
| | | CoFe layer 9b | 1 | ← |
| | | Ru layer 9a | 0.8 | |
| | Second MR magnetic layer 8 | CoFe layer | 3 | → |
| | Nonmagnetic middle layer 7 | ZnO layer | 2 | |
| | First MR magnetic layer 6 | CoFe layer | 3 | ← |
| | First exchange coupling transmission layer 5 | Ru layer 5e | 0.8 | |
| | | CoFe layer 5d | 1 | → |
| | | Ru layer 5c | 0.8 | |
| | | CoFe layer 5b | 1 | ← |
| | | Ru layer 5a | 0.8 | |
| First shield layer 3 | First exchange coupling magnetic field application layer 13 | NiFe layer 13b | 20 | → |
| | | CoFe layer 13a | 1.5 | |
| | First antiferromagnetic layer 12 | IrMn layer | 6 | |
| | First main shield layer 11 | NiFe layer | 1000~2000 | |

As shown in FIG. 2A and Table 1, the MR laminated body 2 comprises a first MR magnetic layer 6 whose direction of magnetization changes in response to an external magnetic field, a nonmagnetic middle layer 7 and a second MR magnetic layer 8 whose direction of magnetization changes in response to an external magnetic field, wherein the first MR magnetic layer 6, the nonmagnetic middle layer 7 and the second MR magnetic layer 8 are in contact with each other in the aforementioned order. A first exchange coupling transmission layer 5 is provided in contact with the first MR magnetic layer 6. A second exchange coupling transmission layer 9 is provided in contact with the second MR magnetic layer 8.

The first MR magnetic layer 6 and the second MR magnetic layer 8 are each made of a CoFe layer. The nonmagnetic middle layer 7 is made of a ZnO layer. The first MR magnetic layer 6 and the second MR magnetic layer 8 may be made of NiFe or CoFeB. The first MR magnetic layer 6 may be made of a bilayer of NiFe/CoFe. The second MR magnetic layer 8 may be made of a bilayer of CoFe/NiFe. A used herein, A/B/C . . . signifies that films A, B, C . . . are laminated in this order. If the first MR magnetic layer 6 and the second MR magnetic layer 8 are each composed of a bilayer, it is preferred to bring the CoFe layer into contact with the ZnO layer. The nonmagnetic middle layer 7 may be made of MgO, $Al_2O_3$, AlN, $TiO_2$ or NiO. If metal or a semiconductor such as ZnO is used for the nonmagnetic middle layer 7, the thin film magnetic head 1 functions as a CPP (Current Perpendicular to the Plane)-GMR (Giant Magneto-Resistance) device. If an insulating material such as MgO is used, the thin film magnetic head 1 functions as a TMR (Tunneling Magneto-Resistance) device.

The first exchange coupling transmission layer 5 is provided between the first MR magnetic layer 6 and the first exchange coupling magnetic field application layer 13 of the first shield layer 3 and, as described below in detail, has the function of transmitting an exchange coupling magnetic field applied from the first exchange coupling magnetic field application layer 13 to the first MR magnetic layer 6. In the present embodiment, the first exchange coupling transmission layer 5 is composed of five layers: a Ru layer/a CoFe layer/a Ru layer/a CoFe layer/a Ru layer.

Likewise, the second exchange coupling transmission layer 9 is provided between the second MR magnetic layer 8 and the second exchange coupling magnetic field application layer 14 of the second shield layer 4 and, as described below in detail, has the function of transmitting an exchange coupling magnetic field applied from the second exchange coupling magnetic field application layer 14 to the second MR magnetic layer 8. In the present embodiment, the second exchange coupling transmission layer 9 is composed of three layers: a Ru layer/a CoFe layer/a Ru layer.

The first shield layer 3 functions as an electrode for flowing a sense current in the direction P at right angles to the film surface of the MR laminated body. This is also true for the second shield layer 4. The first shield layer 3 is provided facing the MR magnetic layer 6 via a first exchange coupling transmission layer 5. The first shield layer 3 comprises the first exchange coupling magnetic field application layer 13, the first antiferromagnetic layer 12, which is provided in contact with the first exchange coupling magnetic field application layer 13 on the rear face of the first exchange coupling magnetic field application layer 13 seen from the first MR magnetic layer 6, and a first main shield layer 11 provided on the rear face of the first antiferromagnetic layer 12 seen from the first MR magnetic layer 6. The first exchange coupling magnetic field application layer 13 is made of a bilayer of a CoFe layer 13a provided in contact with the first antiferromagnetic layer 12 and a NiFe layer 13b provided in contact with both the CoFe layer 13a and the first exchange coupling transmission layer 5. The thickness of the first exchange coupling magnetic field application layer 13 is preferably in the range of 5~80 nm as described below. The first antiferromagnetic layer 12 is made of IrMn and is antiferromagnetically coupled with the adjacent CoFe layer 13a. The first antiferromagnetic layer 12 may be made of an alloy such as Fe—Mn, Ni—Mn, Pt—Mn or Pd—Pt—Mn or a combination of these including IrMn. The first main shield layer 11 is made of a NiFe layer and blocks an external magnetic field applied from the adjacent bit on the same track of a recording medium M. The configuration of the first main shield layer 11 is the same as that of a conventionally well-known main shield layer and is normally in the range of 1~2 μm in thickness. The first main shield layer 11 is thicker than the first exchange coupling magnetic field application layer 13 and the first antiferromagnetic layer 12. In general, the first main shield layer 11 is highly permeable because of its multiple magnetic domain structure. The first main shield layer 11 therefore functions as a shield with high efficiency.

The configuration of the second shield layer 4 is the same as that of the first shield layer 3. That is, the second shield layer 4 is provided facing the MR magnetic layer 8 via a second exchange coupling transmission layer 9. The second shield layer 4 comprises the second exchange coupling magnetic field application layer 14, the second antiferromagnetic layer 15, which is provided in contact with the second exchange coupling magnetic field application layer 14 on the rear face of the second exchange coupling magnetic field application layer 14 seen from the second MR magnetic layer 8, and a second main shield layer 16 provided on the rear face of the second antiferromagnetic layer 15 seen from the second MR magnetic layer 8. The second exchange coupling magnetic field application layer 14 is made of a bilayer of a CoFe layer 14b provided in contact with the second antiferromagnetic layer 15 and a NiFe layer 14a provided in contact with both the CoFe layer 14b and the second exchange coupling transmission layer 9.

The thickness of the second exchange coupling magnetic field application layer 14 is in the range of 5~80 nm. The second antiferromagnetic layer 15 is made of IrMn and is antiferromagnetically coupled with the adjacent CoFe layer 14b. The second antiferromagnetic layer 15 may be made of an alloy such as Fe—Mn, Ni—Mn, Pt—Mn or Pd—Pt—Mn. The second main shield layer 16 is made of a NiFe layer and blocks an external magnetic field applied from the adjacent bit on the same track of a recording medium M. The configuration of the second main shield layer 16 is the same as that of a conventionally well-known main shield layer and is normally in the range of 1~2 μm in thickness. The second main shield layer 16 is thicker than the second exchange coupling magnetic field application layer 14 and the second antiferromagnetic layer 15. In general, the second main shield layer 16 is highly permeable because of its multiple magnetic domains structure. The second main shield layer 16 therefore functions as a shield with high efficiency.

The first and second antiferromagnetic layer 12 and 15 of the first and second shield layer 3 and 4 are in contact with the CoFe 13a and 14b of the first and second exchange coupling magnetic field application layers 13 and 14, respectively, in order to secure high exchange coupling strength with the first and second antiferromagnetic layers 12 and 15. If the first and second antiferromagnetic layers 12 and 15 are in contact with the NiFe layers 13b and 14a, respectively, the exchange coupling strength becomes so small that it is difficult to strongly fix the direction of magnetization in the first and second exchange coupling magnetic field application layers 13 and 14 by means of the first and second antiferromagnetic layers 12 and 15, respectively. The NiFe layers 13b and 14a are provided for improving the soft magnetic property of the shield layers, thus allowing effectively exercising the function as shield layers.

A nonmagnetic layer (not shown here) such as Cu may be inserted into the space between the second antiferromagnetic layer 15 and the second main shield layer 16. In the case of Cu, about 1 nm is enough for the thickness of a nonmagnetic layer. By inserting a nonmagnetic layer, the main shield layer 16 tends to have multiple magnetic domains. As a result, the shielding performance of the main shield layer 16 is enhanced against an external magnetic field. On the other hand, if no nonmagnetic layer is provided, there hardly occur any noises caused by the movement of magnetic domains in the main shield layer 16. Accordingly, it is a matter of choice in terms of design whether to insert a nonmagnetic layer or not.

As shown in FIG. 2A, an insulating layer 17 made of $Al_2O_3$ is formed on both sides of the MR laminated body in the direction of track width T. The provision of the insulating layer 17 allows focusing a sense current, which flows in the direction P at right angles to the film surface of the MR laminated body 2, on the MR laminated body 2. Any thickness of the insulating layer 17 is allowed on the side faces of the MR laminated body as far as it is sufficient for insulation. It is allowed to have a conductive layer on the outside thereof. In such a case, however, the first shield layer 3 and the second shield layer 4 also need to be insulated.

As shown in FIG. 2B, a bias magnetic field application layer 18 is provided for the MR laminated body 2 on the opposite side of the ABS S via an insulating layer 19 made of $Al_2O_3$. The bias magnetic field application layer 18 is a hard magnetic film made of CoPt or CoCrPt and allows applying a bias magnetic field to the MR laminated body in the direction Q at right angles to the ABS S. The insulating layer 19 prevents a sense current from flowing into the bias magnetic field application layer 18.

Above the second shield layer 4, as shown in FIG. 1, a writing part 20 is provided via an inter-device shield layer 31 formed by a sputtering method or the like. The writing part 20 has the configuration of perpendicular magnetic recording. The magnetic pole layer for writing is composed of a main magnetic pole layer 21 and an auxiliary magnetic pole layer 22. The magnetic pole layers 21 and 22 are formed by a frame plating method or the like. The main magnetic pole layer 21 is made of FeCo and exposed on the ABS S in the direction substantially at right angles to the ABS S. The main magnetic pole 21 is wound around by a coil layer 23, which extends above a gap layer 24 made of insulating material. Magnetic flux is induced in the main magnetic pole layer 21 by the coil layer 23. The coil layer 23 is formed by a frame plating method or the like. The magnetic flux is guided inside the main magnetic pole layer 21 and released toward a recording medium at the ABS S. The main magnetic pole layer 21 is narrowed in the vicinity of the ABS S not only in the direction P at right angles to the film surface but also in the direction of track width T (i.e., the direction at right angles to the paper surface; See FIG. 2A), thus generating a minute and powerful write magnetic field that matches with high-density recording.

The auxiliary magnetic pole layer 22 is a magnetic pole layer magnetically coupled with the main magnetic pole layer 21. The auxiliary magnetic pole layer 22 is a magnetic pole layer of about 0.01 μm~about 0.5 μm in film thickness made of an alloy composed of two or three metals selected from the group of Ni, Fe and Co. The auxiliary magnetic pole layer 22 is branched off from the main magnetic pole layer 21 and faces the main magnetic pole layer 21 at the ABS S via the gap layer 24 and the coil insulating layer 25. On the edge portion of the auxiliary magnetic pole layer 22 at the ABS S is formed a trailing shield section whose cross section is wider than that of the other portions of the auxiliary magnetic pole layer 22. The provision of the auxiliary magnetic pole layer 22 having the aforementioned configuration allows the magnetic field gradient between the auxiliary magnetic pole layer 22 and the main magnetic pole layer 21 to become steeper in the vicinity of the ABS S. As a result, the jitter of signal outputs is made small, which leads to a decline in error rates at the time of readout.

Figure 3B:
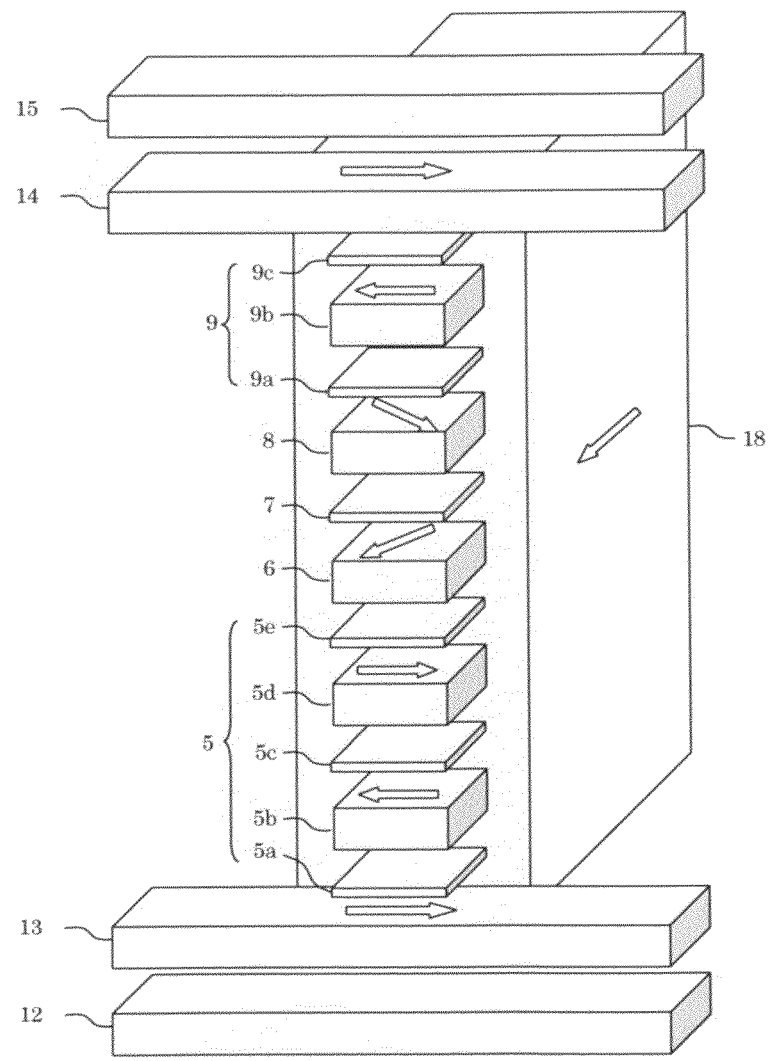
Figure 3C:
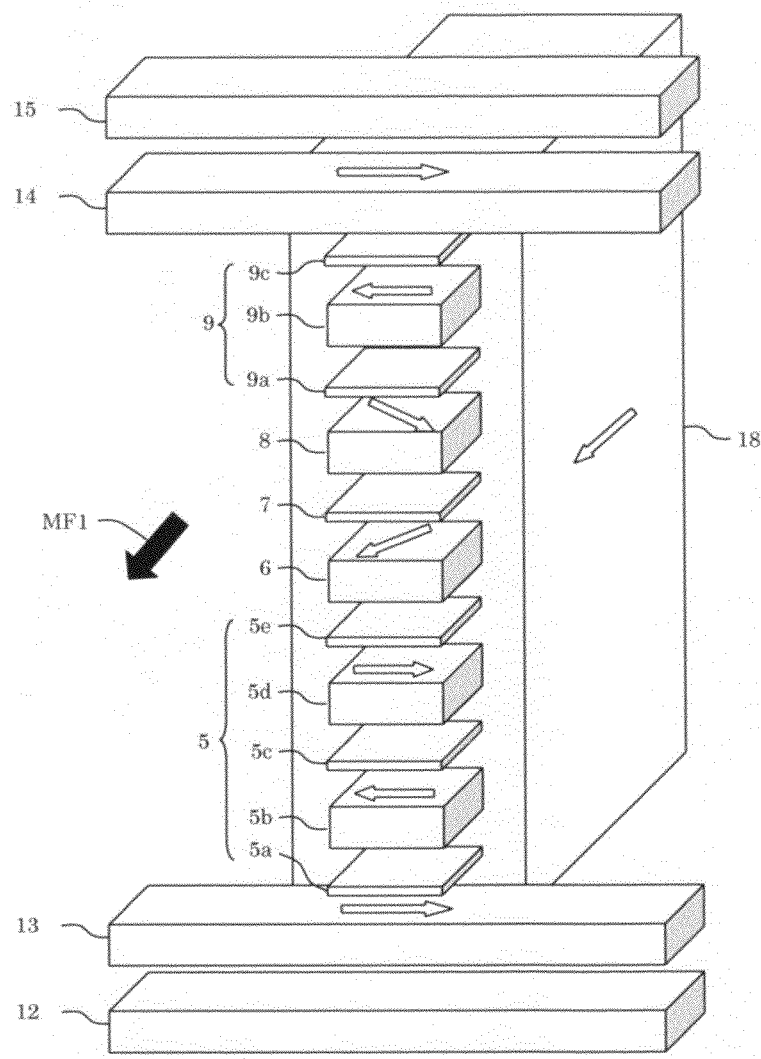
Figure 4:
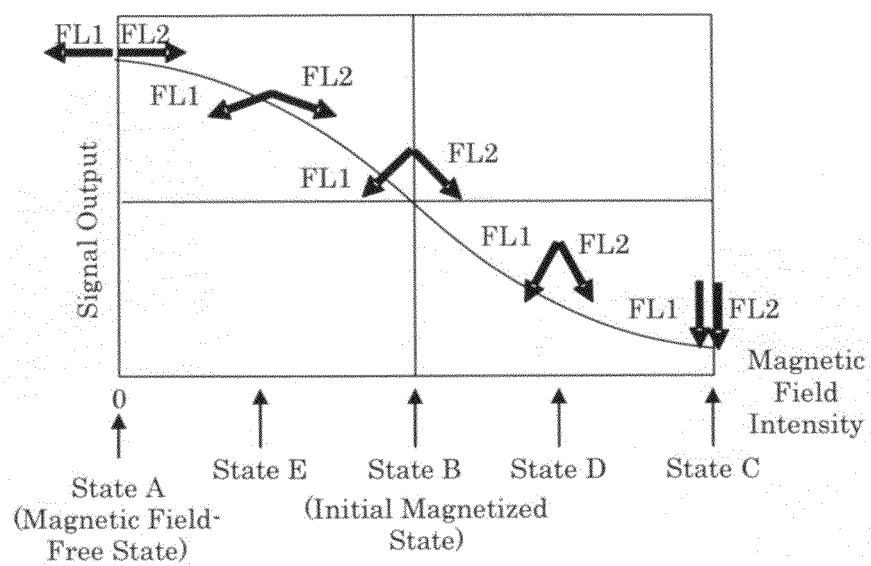
FIG. 4 is a schematic view showing the relationship between magnetic field intensity applied to first and second MR magnetic layers and signal inputs.

Next, as shown in FIGS. 3A~3D and FIG. 4, we will explain the operational principle for reading out magnetic information recorded on a recording medium by means of the thin film magnetic field head according to the present invention. First, let us assume the magnetic field-free state in which neither an external magnetic field nor a bias magnetic field from the bias magnetic field application layer 18 has been applied. FIG. 3A is a schematic view illustrating the magnetization state of the MR laminated body and shield layers in such a virtual state. To show that no bias magnetic field has been applied, the bias magnetic field application layer 18 is shown with a dash line. FIG. 4 is a schematic view showing the relationship between magnetic field intensity applied to the first and second MR magnetic layers and signal inputs. The X-axis and Y-axis show magnetic field intensity and signal outputs, respectively. In FIGS. 3A~3D, each hollow arrow shows the direction of magnetization in each magnetic layer.

The first antiferromagnetic layer 12 of the first shield layer 3 and the second antiferromagnetic layer 15 of the second shield layer 4 are magnetized in advance in the same direction (left-hand direction). Accordingly, the first exchange coupling magnetic field application layer 13 is magnetized in the right direction in the drawing by means of antiferromagnetic coupling with the first antiferromagnetic layer 12. Likewise, the second exchange coupling magnetic field application layer 14 is magnetized in the right-hand direction in the drawing by means of antiferromagnetic coupling with the second antiferromagnetic layer 15.

The first exchange coupling transmission layer 5 has a laminated structure composed of a Ru layer 5a, a CoFe layer 5b, a Ru layer 5c, a CoFe layer 5d and a Ru layer 5e. The CoFe layer 5b and the first antiferromagnetic layer 13 are exchange-coupled via the Ru layer 5a. The exchange coupling strength of Ru is known to have positive or negative values depending on the film thickness. For example, high negative exchange coupling strength is generated if the film thickness is 0.4 nm, 0.8 nm or 1.7 nm, for example, wherein the negative exchange coupling refers to the state in which the direction of magnetization becomes antiparallel to each other on magnetic layers on both sides of the Ru layer. Accordingly, the CoFe layer 5b is magnetized in the left-hand direction in the drawing by setting the film thickness of the Ru layer 5a to the aforementioned values. Likewise, the CoFe layer 5b and the CoFe layer 5d are exchange-coupled via the Ru layer 5c.

Furthermore, the CoFe layer 5d and the first MR magnetic layer 6 are exchange-coupled via the Ru layer 5e. The first MR magnetic layer 6 is magnetized in the left-hand direction by setting the film thickness of the Ru layers 5c and 5e to 0.4 nm, 0.8 nm or 1.7 nm, for example. This is also true for the direction of magnetization in the second antiferromagnetic layer 15, the second exchange coupling magnetic field application layer 14, the second exchange coupling transmission layer 9 and the second MR magnetic layer 8. Accordingly, as shown in FIG. 3A, the second MR magnetic layer 8 is magnetized in the right-hand direction in the drawing.

The state A in FIG. 4 shows the state in FIG. 3A. The direction of magnetization FL1 in the first MR magnetic layer 6 and the direction of magnetization FL2 in the second MR magnetic layer 8 run antiparallel to each other because there is neither any bias magnetic field applied from the bias magnetic field layer 18 nor any external magnetic field applied from the recording medium M. Nevertheless, it is not necessary for the direction of magnetization FL1 in the first MR magnetic layer 6 and the direction of magnetization FL2 in the second MR magnetic layer 8 to be exactly antiparallel to each other, as far as the directions of magnetization rotate in the opposite direction to each other at a time when a bias magnetic field is applied, as described below.

Thus, the first exchange coupling transmission layer 5 magnetically ties the first exchange coupling magnetic field application layer 13 with the first MR magnetic layer 6. The first exchange coupling magnetic field application layer 13 plays a role in applying an exchange coupling magnetic field in the direction parallel to the ABS S to the first MR magnetic layer 6 via the first exchange coupling transmission layer 5. Likewise, the second exchange coupling transmission layer 9 magnetically ties the second exchange coupling magnetic field application layer 14 with the second MR magnetic layer 8. The second exchange coupling magnetic field application layer 14 plays a role in applying an exchange coupling magnetic field in the direction parallel to the ABS S to the second MR magnetic layer 8 via the second exchange coupling transmission layer 9. As a result, the first MR magnetic layer 6 and the second MR magnetic layer 8 are magnetized in antiparallel with each other in the magnetic field-free state.

Next, as shown in FIG. 3B, let us assume the state in which only a bias magnetic field is applied (i.e., there is no external magnetic field applied) because a bias magnetic field is actually applied to the first MR magnetic layer 6 and the second MR magnetic layer 8. Here, a bias magnetic field is applied in the direction toward the ABS S. The directions of magnetization in the first MR magnetic layer 6 and the second MR magnetic layer 8 are rotated in the direction toward the ABS S under the influence of the bias magnetic field. As a result, the directions of magnetization in the first MR magnetic layer 6 and the second MR magnetic layer 8 are rotated in the direction toward the parallel state from the antiparallel state, which results in the initial magnetized state (i.e., the state in which only a bias magnetic field is applied) as shown in FIG. 4 as the state B. In FIG. 4, the positive directions of the bias magnetic field and external magnetic field are downward.

If an external magnetic field is applied from the recording medium M at the time, the relative angle between the direction of magnetization in the first MR magnetic layer 6 and the direction of magnetization in the second MR magnetic layer 8 increases or decreases depending on the direction of the external magnetic field. Specifically, as shown in FIG. 3C, if a magnetic field MF1, which is directed toward the recording medium M from the ABS S, is applied from the recording medium M, the directions of magnetization in the first MR magnetic layer 6 and the second MR magnetic layer 8 are further rotated toward the ABS S. As a result, the directions of magnetization in the first MR magnetic layer 6 and the second MR magnetic layer 8 come closer to the parallel state (i.e., the state D in FIG. 4). The closer they come to the parallel state, the less easily electrons supplied from electrodes (i.e., the first and second shield layers 3 and 4) are scattered. As a result, the electrical resistance value of a sense current declines. In other words, signal outputs declines. On the contrary, as shown in FIG. 3D, if a magnetic field MF2, which is directed toward the ABS S from the recording medium M, is applied, the directions of magnetization in the first MR magnetic layer 6 and the second MR magnetic layer 8 are rotated in the direction away from the ABS S. As a result, the directions of magnetization in the first MR magnetic layer 6 and the second MR magnetic layer 8 come closer to the antiparallel state (i.e., the state E in FIG. 4). The closer they come to the antiparallel state, the more easily electrons supplied from the electrodes are scattered. As a result, the electrical resistance value of a sense current increases. In other words, signal outputs increases. Thus, an external magnetic field can be detected using the change in the relative angle between the directions of magnetization in the first MR magnetic layer 6 and the second MR magnetic layer 8.

The first and second exchange coupling transmission layers 5 and 9 are hardly influenced by an external magnetic field because the directions of magnetization in the magnetic layers inside thereof are strongly fixed by exchange coupling.

For this reason, the directions of magnetization in the first MR magnetic layer 6 and the second MR magnetic layer 8 are hardly influenced by the change in the directions of magnetization in the first and second exchange coupling transmission layers 5 and 9; the directions of magnetization are mainly changed in response to an external magnetic field.

In the present embodiment, the film thickness and shape of the bias magnetic field application layer 18 is controlled such that the directions of magnetization in the first MR magnetic layer 6 and the second MR magnetic layer 8 are substantially at right angles to each other in the state B (i.e., the initial magnetized state). As shown in FIG. 4, if the directions of magnetization are at right angles to each other in the initial magnetized state, the output change (i.e., an inclination of signal outputs) becomes large in response to the change in an external magnetic field, resulting in high rates of change in magnetoresistance and good output symmetry.

As described above, the first and second exchange coupling transmission layers 5 and 9 have the function of transmitting information about the directions of magnetization in the first and second exchange coupling magnetic field application layers 13 and 14, and particularly the anisotropic property of the direction of magnetization, to the first and second MR magnetic layers 6 and 8. Nonetheless, it should be noted that the first and second exchange coupling transmission layers 5 and 9 also have the function of adjusting a read gap. The target value of a read gap is determined based on the linear recording density to be achieved by a thin film magnetic head. However, since the thickness of the first and second MR magnetic layer 6 and 8 and the nonmagnetic middle layer 7 are determined based on a variety of other factors, the first and second exchange coupling transmission layers 5 and 9 have the function of adjusting a read gap to a desired size.

As described above, there is only a small degree of freedom for the thickness of Ru layers constituting the first and second exchange coupling transmission layers 5 and 9. To fix the direction of magnetization in the CoFe layer with respect to an external magnetic field, the CoFe layer cannot be made very thick, either. If large thickness is required for the first and second exchange coupling transmission layers 5 and 9, it is therefore desirable to increase the number of laminated Ru and CoFe layers. In the present embodiment, the first and second exchange coupling transmission layers 5 and 9 use a three-layer configuration of a Ru layer/a CoFe layer/a Ru layer or a five-layer configuration of a Ru layer/a CoFe layer/a Ru layer/a CoFe layer/a Ru layer. It is, however, allowed to use other configurations including a seven-layer configuration of a Ru layer/a CoFe layer/a Ru layer/a CoFe layer/a Ru layer/a CoFe layer/a Ru layer, for example.

It is desirable to take into consideration the following points at the time of setting the configurations of the first and second exchange coupling transmission layers 5 and 9. To stabilize the magnetized state, the magnetizing directions of the first and second antiferromagnetic layers 12 and 15 should be the same in view of the magnetizing process. For this reason, the first and second antiferromagnetic layers 12 and 15 are magnetized in the left-hand direction in FIG. 3A in the present embodiment. Needless to say, both the first and second antiferromagnetic layers 12 and 15 may be magnetized in the right-hand direction. It is also desirable that the first MR magnetic layer 6 and the second MR magnetic layer 8 are magnetized in antiparallel with each other on both sides of the nonmagnetic middle layer 7 in the initial magnetized state. In the present embodiment, the number of a combination of a Ru layer/a CoFe layer, which functions as antiferromagnetic coupling, is adjusted. The first MR magnetic layer 6 and the second MR magnetic layer 8 are magnetized in antiparallel with each other by making a five-layer configuration of a Ru layer/a CoFe layer/a Ru layer/a CoFe layer/a Ru layer for the first exchange coupling transmission layer 5 and a three-layer configuration of a Ru layer/a CoFe layer/a Ru layer for the second exchange coupling transmission layer 9. It is also allowed to make a three-layer configuration of a Ru layer/a CoFe layer/a Ru layer for the first exchange coupling transmission layer 5 and a five-layer configuration of a Ru layer/a CoFe layer/a Ru layer/a CoFe layer/a Ru layer for the second exchange coupling transmission layer 9.

If a desired read gap is small, either the first exchange coupling transmission layer 5 or the second exchange coupling transmission layer 9 may have a single layer configuration composed of a Ru layer. Table 2 shows a film configuration, wherein the second exchange coupling transmission layer 9 has a single layer configuration composed of a Ru layer. The first exchange coupling transmission layer 5 has a three-layer configuration of a Ru layer/a CoFe layer/a Ru layer so that the first and second antiferromagnetic layers 12 and 15 can have the same direction of magnetization and that the first MR magnetic layer 6 and the second MR magnetic layer 8 can be magnetized in antiparallel with each other. Needless to say, it is allowed that the first exchange coupling transmission layer 5 has a single layer configuration composed of a Ru layer and that the second exchange coupling transmission layer 9 has a three-layer configuration composed of a Ru layer/a CoFe layer/a Ru layer. Moreover, if the first and second antiferromagnetic layers 12 and 15 have the opposite direction of magnetization, both the first and second exchange coupling transmission layers 5 and 9 can each have a single layer configuration composed of a Ru layer.

TABLE 2

| | Layer configuration | | Thickness (nm) | Direction of magnetization |
|---|---|---|---|---|
| Second shield layer 4 | Second main shield layer 16 | NiFe layer | 1000~2000 | |
| | Second antiferromagnetic layer 15 | IrMn layer | 6 | |
| | Second exchange coupling magnetic field application layer 14 | CoFe layer 14b | 1.5 | |
| | | NiFe layer 14a | 20 | ← |
| MR laminated body 2 | Second exchange coupling transmission layer 9 | Ru layer | 0.8 | |
| | Second MR magnetic layer 8 | CoFe layer | 3 | → |
| | Nonmagnetic middle layer 7 | ZnO layer | 2 | |
| | First MR magnetic layer 6 | CoFe layer | 3 | ← |
| | First exchange coupling transmission layer 5 | Ru layer 5c | 0.8 | |
| | | CoFe layer 5b | 1 | → |
| | | Ru layer 5a | 0.8 | |

TABLE 2-continued

| | Layer configuration | | Thickness (nm) | Direction of magnetization |
|---|---|---|---|---|
| First shield layer 3 | First exchange coupling magnetic field application layer 13 | NiFe layer 13b | 20 | ← |
| | | CoFe layer 13a | 1.5 | |
| | First antiferromagnetic layer 12 | IrMn layer | 6 | |
| | First main shield layer 11 | NiFe layer | 1000~2000 | |

Thus, the thin film magnetic head according to the present invention can have a configuration comprising a magnetic layer (exchange coupling transmission layer) composed of at least one Ru layer in the space between the first MR magnetic layer 6 and the first exchange coupling magnetic field application layer 13 and/or in the space between the second MR magnetic layer 8 and the second exchange coupling magnetic field application layer 14. It is also possible to have a configuration comprising a exchange coupling transmission layer composed of a Ru layer in the space between the first MR magnetic layer 6 and the first exchange coupling magnetic field application layer 13 and/or in the space between the second MR magnetic layer 8 and the second exchange coupling magnetic field application layer 14.

Moreover, as shown in FIG. 5, a synthetic exchange coupling magnetic field application layer 41 may be used in place of the first exchange coupling magnetic field application layer 13, said synthetic exchange coupling magnetic field application layer comprising a pair of antiferromagnetically coupled ferromagnetic layers 41a and 41c on both sides of a nonmagnetic conductive layer 41b made of Ru and the like. The ferromagnetic layers 41a and 41c may each have a laminated structure of a CoFe layer, a NiFe layer, a CoFe layer and a NiFe layer. If the nonmagnetic conductive layer 41b is composed of a Ru layer, the film thickness is preferably about 0.8 nm. The total film thickness of the synthetic exchange coupling magnetic field application layer 41 is preferably in the range of about 5~100 nm.

In this configuration, the direction of magnetization is counter-rotated once inside the first shield layer 3; therefore the first exchange coupling transmission layer 5 can be made a three-layer configuration of a Ru layer/a CoFe layer/a Ru layer. As a result, the film configuration and thickness of the first exchange coupling transmission layer 5 and the second exchange coupling transmission layer 9 can be made the same. Moreover, as shown by the comparison between FIG. 3A and FIG. 5, the thickness of the first exchange coupling transmission layer 5 can be decreased, which leads to a decline in a read gap, thus further contributing to high-density recording.

In place of the first exchange coupling magnetic field application layer 13, the second exchange coupling magnetic field application layer 14 may have a synthetic configuration of a ferromagnetic layer/a non magnetic conductive layer/a ferromagnetic layer. In short, the first exchange coupling transmission layer 5, the second exchange coupling transmission layer 9, the first exchange coupling magnetic field application layer 13 and the second exchange coupling magnetic field application layer 14 can properly be set in the present invention in such a way that the directions of magnetization can be made the same between the first antiferromagnetic layer 12 and the second antiferromagnetic layer 15 and that the first MR magnetic layer 6 and the second MR magnetic layer 8 can be magnetized in antiparallel with each other.

In the case of using a plurality of CoFe layers, the thickness of CoFe layers should preferably be the same. The CoFe layer is magnetized by an external magnetic field, and the direction of magnetization is liable to be rotated toward the external magnetic field. If the thickness of CoFe layers is different, a CoFe layer of large film thickness becomes more liable to be rotated, overcoming exchange coupling, resulting in inhibiting the function of transmitting information about the directions of magnetization in the first and second exchange coupling magnetic field application layer 13 and 14 to the first and second MR magnetic layers 6 and 8.

The thin film magnetic head according to the present embodiment can be produced by the following method. First, the first shield layer 3 is formed on a substrate 91 (See FIG. 1). Next, each layer constituting the MR laminated body 2 is formed on the first shield layer 3 by sputtering. Then, each layer is patterned, and both portions in the direction of track width T are filled in with insulating films 17. Afterward, milling is performed, leaving the portion between the ABS S and the height h (See FIG. 1) of the device intact to form the bias magnetic field application layer 18 via the insulating layer 19. Thus, the insulating layer 17 is formed on both side surfaces of the MR laminated body 2 in the direction of track width T and the bias magnetic field application layer 18 on the rear side of the MR laminated body seen from the ABS S. Subsequently, the second shield layer 4 is formed. Then, the aforementioned writing part 20 is formed by a will-known method in the art.

Exemplary Embodiment

We made the first antiferromagnetic layer 12 by forming the first shield layer 3 of 1 μm in thickness on an ALTiC ($Al_2O_3$—TiC) substrate and then accumulating an IrMn alloy of 5 nm in thickness thereon using a DC magnetron sputtering device. We then formed the first exchange coupling magnetic field application layer 13 by accumulating a CoFe alloy and a NiFe alloy in this order using the thickness as a parameter. Then, we formed the first exchange coupling transmission layer 5 by accumulating a multilayer film composed of a Ru layer of 0.8 nm in thickness, a CoFe alloy of 1 nm in thickness and a Ru layer of 0.8 nm in thickness.

On the first exchange coupling transmission layer 5, we accumulated the first MR magnetic layer 6 of 4 nm in thickness, the nonmagnetic middle layer 7 of 2 nm in thickness made of ZnO and the second MR magnetic layer 8 of 4 nm in thickness in sequence. Then, we accumulated the second exchange coupling transmission layer 9 having the same configuration as that of the first exchange coupling transmission layer 5 to form reproducing head shape by milling. Next, we accumulated a NiFe alloy and a CoFe alloy in this order using the thickness as a parameter to form the second exchange coupling magnetic field application layer 14. By accumulating an IrMn alloy of 5 nm in thickness thereon, we formed the second antiferromagnetic layer 15. After accumulating a Cu layer of 1 nm in thickness thereon, we accumulated a NiFe alloy of 1 μm in thickness to form the second shield layer 4. Afterward, we made reproducing head test samples by magnetic annealing at 250° C. for 3 hours. We also made samples with no first and second exchange coupling magnetic field application layers 13 and 14 as a reference. For each sample, the film thickness of the NiFe alloy and CoFe alloy were the same in both the first exchange coupling magnetic field application layer 13 and the second exchange coupling magnetic field application layer 14.

Figure 6A:
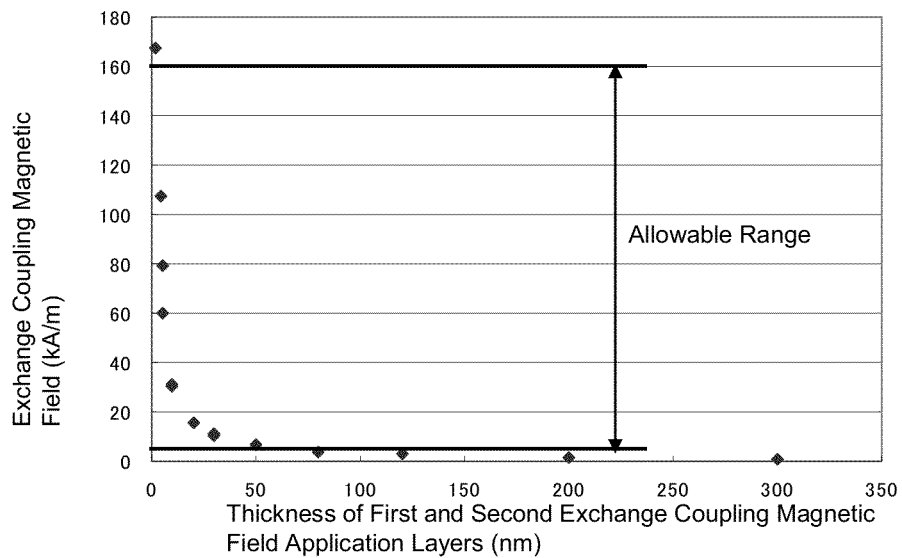
FIG. 6A is a graph showing the relationship between the thickness of exchange coupling magnetic field application layers and the exchange coupling magnetic field.
Figure 6B:
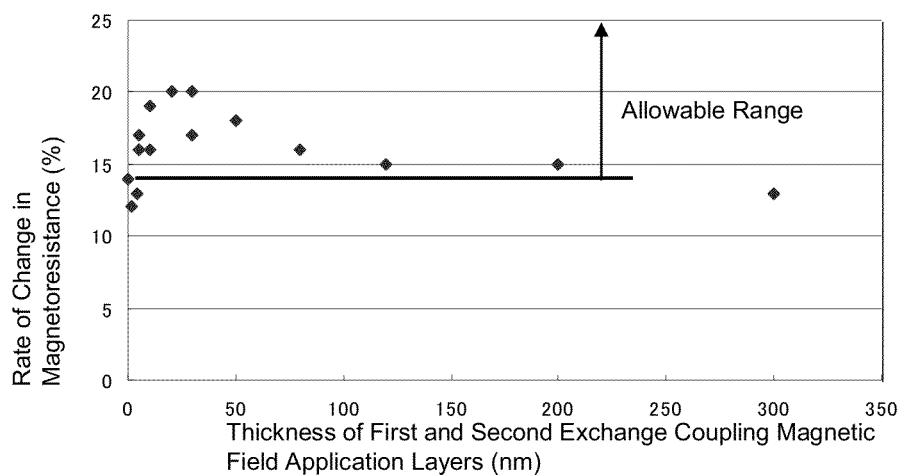
FIG. 6B is a graph showing the relationship between the thickness of exchange coupling magnetic field application layers and the rate of change in MR.
Figure 6C:
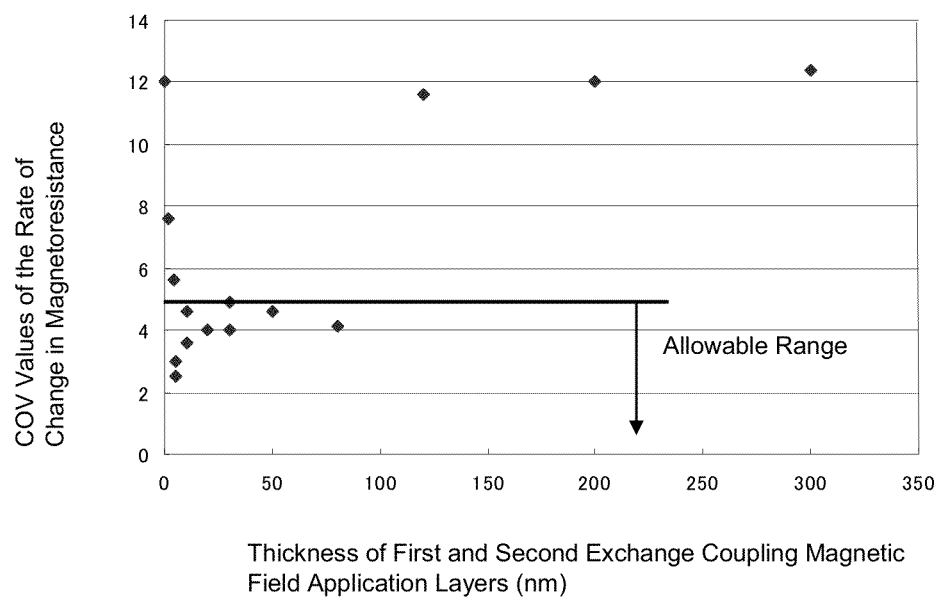
FIG. 6C is a graph showing the relationship between the thickness of exchange coupling magnetic field application layers and the variation of the rate of change in MR.

FIGS. 6A~6C and Table 3 show the exchange coupling magnetic field, rate of change in magnetoresistance (rate of change in MR) and COV values (values found by dividing dispersion with a mean value) of the rate of change in magnetoresistance of test samples thus produced. If the exchange coupling magnetic field is too large, the function of shield layer will be inhibited. If the exchange coupling magnetic field is too small, it will be difficult to fix the direction of magnetization in the first and second MR magnetic layers 6 and 8. In view of these points, we set the allowable range to not less than 4 [kA/m] (50 [Oe]) and not more than 159 [kA/m] (2000 [Oe]). The higher the rate of change in magnetoresistance is, the more preferable. In the present case, however, we recognized the effect of the present invention when it exceeded 14%, which was the rate of change in magnetoresistance in the case of the reference. The smaller the COV value is, the more preferable. However, we set the allowable range to not more than 5% in view of practical use.

As shown in these drawings and Table 3, the exchange coupling magnetic field is within the allowable range when the thickness of the first and second exchange coupling magnetic field application layer 13 and 14 is in the range of 4~80 nm; the rate of change in magnetoresistance is within the allowable range when the thickness is in the range of 5~200 nm; and the variation (COV values) of the rate of change in magnetoresistance is within the allowable range when the thickness is in the range of 5~80 nm. In Table 3, all the cases within the allowable range are shown with half-tone dot meshing. Accordingly, it is preferred that the thickness of the first and second exchange coupling magnetic field application layer 13 and 14 is in the range of 5~80 nm. In Table 3, the cases satisfying all the judgmental standards are referred to as preferred cases, and the corresponding total film thickness is surrounded by a thick line. The comparison between the preferred cases 1 and 2 and between the preferred cases 3 and 4, both of which are the same in total film thickness, shows that a large exchange coupling magnetic field can be generated when CoFe layers are provided in the first and second exchange coupling magnetic field application layer 13 and 14, wherein the CoFe layers are in contact with the first and second antiferromagnetic layers 12 and 15.

TABLE 3

| Thickness of CoFe layer nm | Thickness of NiFe layer nm | Total film thickness nm | Exchange coupling magnetic field | | Rate of change in MR % | Standard deviation | Reference |
|---|---|---|---|---|---|---|---|
| | | | KA/m | Oe | | | |
| 0 | 0 | 0 | | | 14 | 12 | Reference case |
| 1 | 1 | 2 | 167 | 2100 | 12 | 7.6 | Comparative case 1 |
| 1 | 3 | 4 | 107 | 1350 | 13 | 5.6 | Comparative case 2 |
| 0 | 5 | 5 | 60 | 750 | 17 | 3 | Preferred case 1 |
| 1 | 4 | 5 | 80 | 1000 | 16 | 2.5 | Preferred case 2 |
| 0 | 10 | 10 | 30 | 380 | 16 | 4.6 | Preferred case 3 |
| 2 | 8 | 10 | 31 | 390 | 19 | 3.6 | Preferred case 4 |
| 2 | 18 | 20 | 16 | 198 | 20 | 4 | Preferred case 5 |
| 1.5 | 28.5 | 30 | 11 | 135 | 17 | 4.9 | Preferred case 6 |
| 2 | 28 | 30 | 11 | 132 | 20 | 4 | Preferred case 7 |
| 1.5 | 48.5 | 50 | 6 | 80 | 18 | 4.6 | Preferred case 8 |
| 2 | 78 | 80 | 4 | 50 | 16 | 4.1 | Preferred case 9 |
| 2 | 118 | 120 | 3 | 34 | 15 | 11.6 | Comparative case 3 |
| 3 | 197 | 200 | 2 | 19 | 15 | 12 | Comparative case 4 |
| 1 | 299 | 300 | 1 | 13 | 13 | 12.4 | Comparative case 5 |

As described above, in the thin film magnetic head according to the present embodiment and the present exemplary embodiment, the first and second MR magnetic layers 6 and 8, which change in the direction of magnetization in response to an external magnetic field, are magnetized in antiparallel with each other in the magnetic field-free state by means of exchange coupling magnetic fields applied from the first and second exchange coupling magnetic field application layers 13 and 14 via the first and second exchange coupling transmission layers 5 and 9. This eliminates the necessity of using material that has exchange coupling action for the nonmagnetic middle layer 7. It is therefore possible to use any material that can exercise the maximum magnetoresistance effect, which leads to a high rate of change in magnetoresistance. Since the first and second exchange coupling magnetic field application layers 13 and 14 are strongly magnetized by the first and second antiferromagnetic layers 12 and 15, it is easy to control the magnetic state of the first and second MR magnetic layers 6 and 8, which leads to a high rate of change in magnetoresistance, showing less variation. Moreover, the first and second exchange coupling magnetic field application layers 13 and 14 and the first and second antiferromagnetic layers 12 and 15 function as the shield layers 3 and 4, which contributes to a decline in a read gap. In other words, in the thin film magnetic head according to the present embodiment and the present exemplary embodiment, the first and second exchange coupling magnetic field application layers 13 and 14 and the first and second antiferromagnetic layers 12 and 15 have both functions as magnetic control layers for controlling the magnetic state of the first and second MR magnetic layers 6 and 8 and as shield layers.

Figure 7:
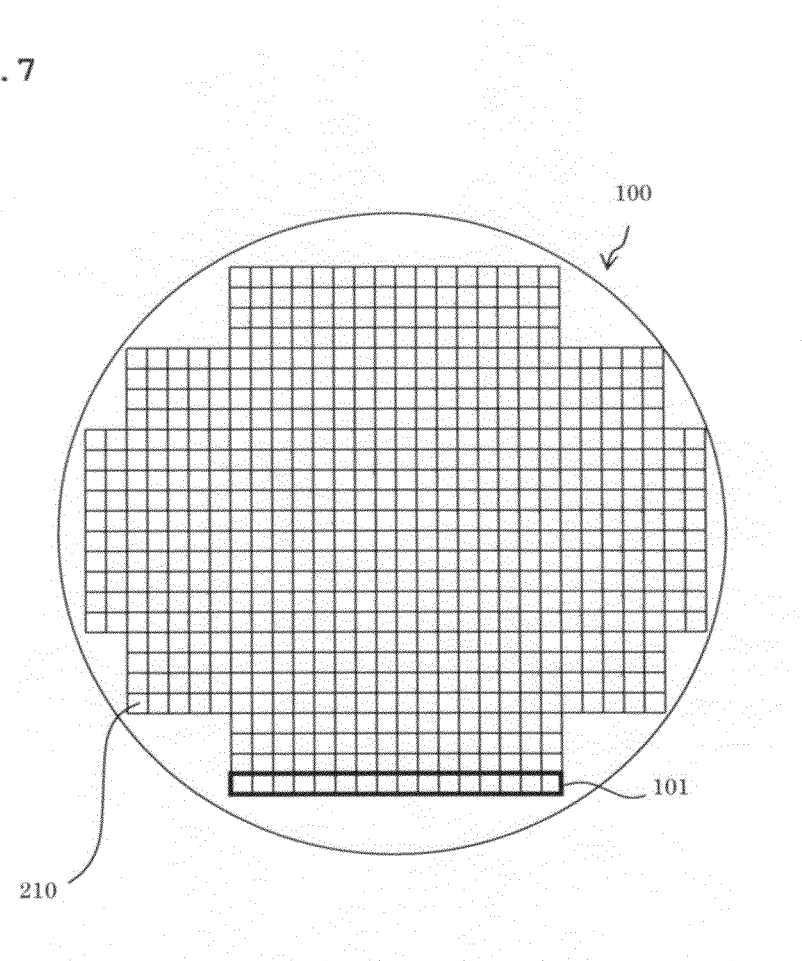
FIG. 7 is a plan view of a wafer relating to the production of the thin film magnetic head according to the present invention.

Next, a wafer used for manufacturing the aforementioned thin film magnetic head is described below. As shown in FIG. 7, on a wafer 100 is formed at least a laminated body constituting the aforementioned thin film magnetic head. The wafer 100 is divided into a plurality of bars 101, which are work units for polishing the ABS S. After polishing, the bar 101 is cut into sliders 210 each containing a thin film magnetic head. The wafer 100 is provided with cutting margins (not shown here) used for cutting the wafer 100 into bars 101 and the bars 101 into sliders 210.

Figure 8:
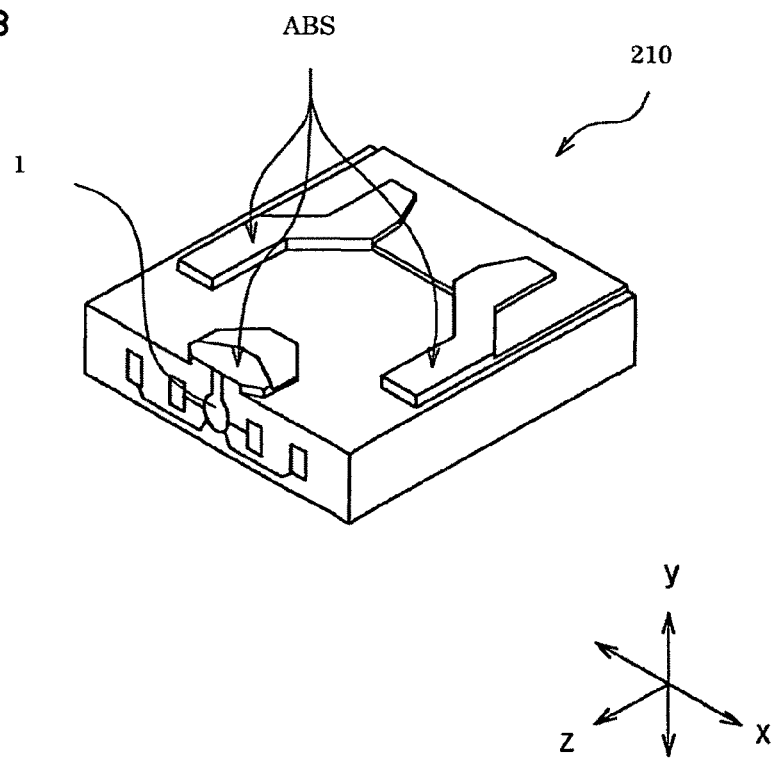
FIG. 8 is a perspective view of the slider according to the present invention.

As shown in FIG. 8, the slider 210 is substantially hexahedron-shaped. One face thereof is the ABS S that faces a hard disk.

Figure 9:
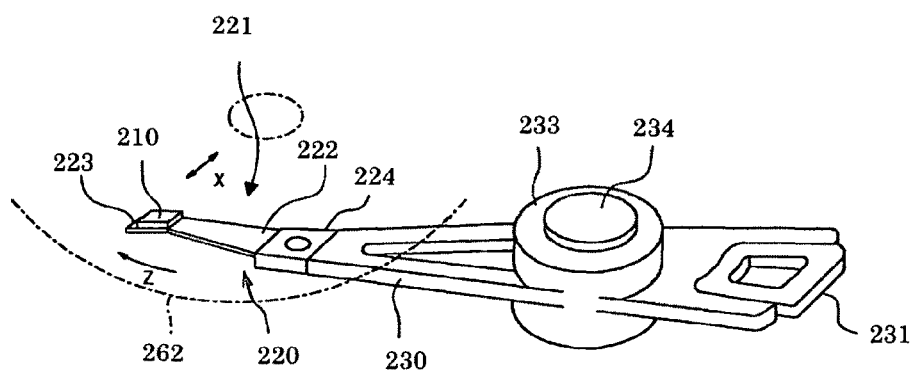
FIG. 9 is a perspective view of a head arm assembly with a head gimbal assembly into which the slider according to the present invention is integrated.

As shown in FIG. 9, a head gimbal assembly 220 comprises a slider 210 and a suspension 221 for elastically supporting the slider 210. The suspension 221 comprises a spring-set load beam 222 made of stainless steel, a flexure 223 provided on one edge of the load beam 222 and a base plate 224 provided on the other edge of the load beams 222. The flexure 223 is provided with the slider 210, giving a proper degree of freedom. On the section in which the slider 210 is mounted on the flexure 223 is provided a gimbal part for keeping the position of the slider 210 constant.

The slider 210 is placed inside a hard disk device, facing a hard disk, which is a disk-shaped recording medium to be rotated. At a time when a hard disk is rotated in the z direction in FIG. 9, airflow passing through the space between the hard disk and the slider 210 provides lift force for the slider 210 downward in the y direction. The slider 210 is moved away from the surface of the hard disk by the lift force. The thin film magnetic head 1 is formed in the vicinity of the edge portion on the air exit side (i.e., the edge portion on the lower left side in FIG. 8) of the slider 210.

The portion in which the head gimbal assembly 220 is mounted on an arm 230 is referred to as a head arm assembly 221. The arm 230 allows moving the slider 210 in the x direction crossing the track of the hard disk 262. One edge of the arm 230 is mounted on the base plate 224. On the other edge of the arm 230, a coil 231 is mounted, which constitutes part of the voice coil motor. A bearing part 233 is provided in the middle section of the arm 230. The arm 230 is rotatably supported by a shaft 234 mounted on the bearing part 233. The arm 230 and the voice coil motor for driving the arm 230 constitute an actuator.

Figure 10:
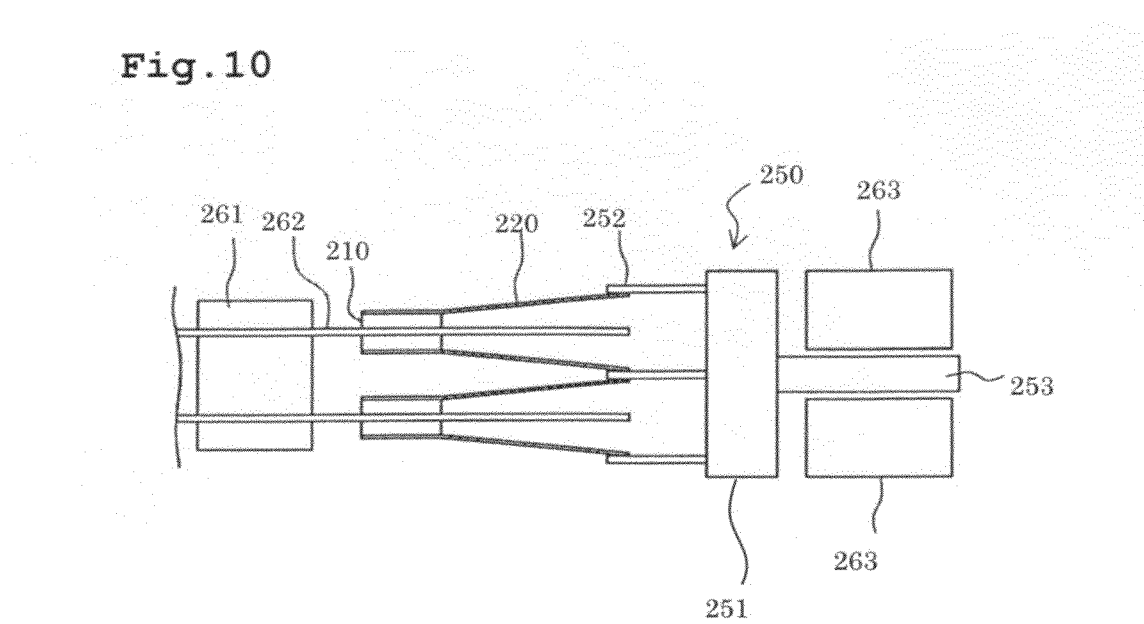
FIG. 10 is a side view of a head arm assembly into which the slider according to the present invention is integrated.
Figure 11:
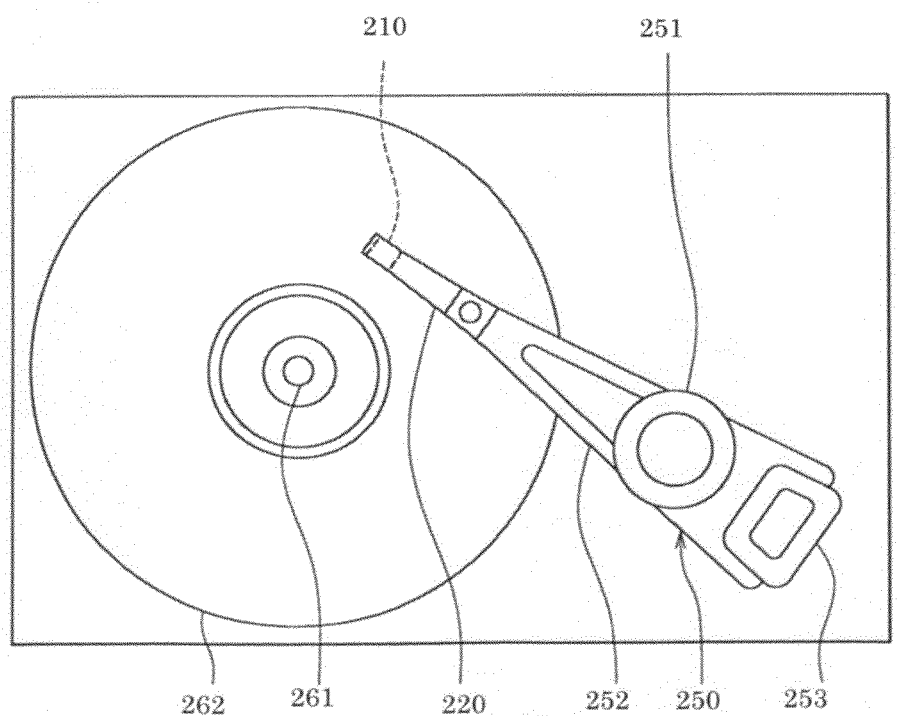
FIG. 11 is a plan view of a hard disk device into which the slider according to the present invention is integrated.

Next, a description of a head stack assembly into which the aforementioned slider is integrated and a hard disk device is given below with reference to FIG. 10 and FIG. 11. The head stack assembly comprises a carriage having a plurality of arms, wherein a head gimbal assembly 220 is mounted on each arm. FIG. 10 is a side view of the head stack assembly. FIG. 11 is a plan view of a hard disk device. The head stack assembly 250 comprises a carriage 251 having a plurality of arms 252. On each arm 252, head gimbal assemblies are mounted at an interval in the vertical direction. On the side of the carriage 251 opposite to the arm 252, the coil 253 is mounted, which constitutes part of a voice coil motor. The voice coil motor has permanent magnets 263 disposed facing each other on both sides of the coil 253.

As shown in FIG. 11, the head stack assembly 250 is integrated into the hard disk device. The hard disk device has multiple hard disks 262 mounted on a spindle motor 261. For each hard disk 262, two sliders 210 are disposed facing each other on both sides of the hard disk 262. The head stack assembly 250 (excluding the slider 210) and an actuator, which correspond to the positioning device according to the present invention, not only support the slider 210 but also position the slider 210 with respect to the hard disk 262. The slider 210 is moved in the direction crossing the track of the hard disk 262 by means of the actuator to be positioned with respect to the hard disk 262. The thin film magnetic head 1 of the slider 210 records information on the hard disk 262 by means of a recording head and reproduces information recorded on the hard disk 262 by means of a reproducing head.

A description of the preferred embodiment according to the present invention was given above in detail. However, it should be appreciated that a wide variety of alterations and modifications are possible as far as they do not depart from the spirit and scope of the attached claims.

What is claimed is:

1. A thin film magnetic head comprising:
a Magneto Resistance ("MR") laminated body composed of a first MR magnetic layer whose direction of magnetization changes in response to an external magnetic field, a nonmagnetic middle layer and a second MR magnetic layer whose direction of magnetization changes in response to an external magnetic field, wherein the first MR magnetic layer, the nonmagnetic middle layer and the second MR magnetic layer are in contact with each other in the order;
first and second shield layers which are provided facing the first MR magnetic layer and the second MR magnetic layer, respectively, and which are arranged in a manner of sandwiching the MR laminated body in an orthogonal direction relative to a film surface of the MR laminated body, and also which function as electrodes for flowing a sense current in the orthogonal direction relative to the film surface of the MR laminated body; and
a bias magnetic field application layer provided on an opposite side of an air bearing surface (ABS) of the MR laminated body in order to apply a bias magnetic field orthogonal relative to the ABS, wherein
the first shield layer comprises:
  a first exchange coupling magnetic field application layer which is provided facing the first MR magnetic layer and which applies an exchange coupling magnetic field to the first MR magnetic layer in a direction parallel to the ABS; and
  a first antiferromagnetic layer which is provided in contact with the first exchange coupling magnetic field application layer on the rear face of the first exchange coupling magnetic field application layer seen from the first MR magnetic layer and which is exchange coupled with the first exchange coupling magnetic field application layer, and
the second shield layer comprises:
  a second exchange coupling magnetic field application layer which is provided facing the second MR magnetic layer and which applies an exchange coupling magnetic field to the second MR magnetic layer, the exchange coupling magnetic field being in a parallel direction to the ABS and in an antiparallel direction to an exchange coupling magnetic field applied to the first MR magnetic layer by the first exchange coupling magnetic field application layer, and
  a second antiferromagnetic layer which is provided in contact with the second exchange coupling magnetic field application layer on the rear face of the second exchange coupling magnetic field application layer seen from the second MR magnetic layer and which is exchange coupled with the second exchange coupling magnetic field application layer,
wherein the first exchange coupling magnetic field application layer, the first antiferromagnetic layer, the second exchange coupling magnetic field application layer and the second antiferromagnetic layer are longer than the MR laminated body both in a track width direction and in a direction perpendicular to the ABS, wherein the bias magnetic field application layer is positioned between the first exchange coupling magnetic field application layer and the second exchange coupling magnetic field application layer, as viewed in a laminating direction of the MR laminated body.

2. The thin film magnetic head according to claim 1, wherein the first and second antiferromagnetic layers respectively contain at least one selected from a group consisting of Fe—Mn, Ni—Mn, Ir—Mn, Pt—Mn and Pd—Pt—Mn.

3. The thin film magnetic head according to claim 2, wherein the first and second exchange coupling magnetic field application layers respectively contain a CoFe alloy layer provided in contact with the first and second antiferromagnetic layers, respectively.

4. The thin film magnetic head according to claim 2, wherein only one of the first and second exchange coupling magnetic field application layers contains ferromagnetic layers antiferromagnetically coupled with each other on both sides of a nonmagnetic conductive layer.

5. The thin film magnetic head according to claim 1, wherein the thickness of the first and second exchange coupling magnetic field application layers is each in the range of 5~80 nm.

6. The thin film magnetic head according to claim 1, wherein the MR laminated body includes a first exchange coupling transmission layer composed of a magnetic layer including at least one ruthenium (Ru) layer between the first MR magnetic layer and the first exchange coupling magnetic field application layer and/or between the second MR magnetic layer and the second exchange coupling magnetic field application layer.

7. The thin film magnetic head according to claim 1, wherein the MR laminated body includes a first exchange coupling transmission layer composed of a ruthenium (Ru) layer at least one of between the first MR magnetic layer and the first exchange coupling magnetic field application layer and between the second MR magnetic layer and the second exchange coupling magnetic field application layer.

8. A slider equipped with the thin film magnetic head according to claim 1.

9. A wafer on which laminated bodies are formed, the laminated bodies being configured as the thin film magnetic heads according to claim 1.

10. A head gimbal assembly comprising the slider according to claim 8 and a suspension for elastically supporting the slider.

11. A hard disk device comprising the slider according to claim 8 and a device for supporting the slider and positioning the slider with respect to a recording medium.

12. The thin film magnetic head according to claim 1,
wherein the first shield layer further comprises a first main shield layer provided in contact with the first antiferromagnetic layer on the rear face of the first antiferromagnetic layer, and
wherein the second shield layer further comprises a second main shield layer provided in contact with the second antiferromagnetic layer on the rear face of the second antiferromagnetic layer.

13. The thin film magnetic head according to claim 12,
wherein the thickness of the first shield layer is greater than the combination of the first exchange coupling magnetic field application layer and the first antiferromagnetic layer, and
wherein the thickness of the second shield layer is greater than the combination of the second exchange coupling magnetic field application layer and the second antiferromagnetic layer.

14. The thin film magnetic head according to claim 1, wherein the MR laminated body gradually decreases in length in the track width direction as the MR laminated body extends from the first shield layer to the second shield layer.

15. The thin film magnetic head according to claim 1, wherein each of the first MR magnetic layer, the nonmagnetic middle layer and the second MR magnetic layer composing the MR laminated body gradually decreases in length in the track width direction as the MR laminated body extends in a sense current flow direction from the first shield layer to the second shield layer.

16. The thin film magnetic head according to claim 1, further comprising an insulating layer disposed between the bias magnetic field application layer and the ABS to prevent a sense current from flowing into the bias magnetic field application layer.

* * * * *